(12) United States Patent
Ohta

(10) Patent No.: US 11,903,239 B2
(45) Date of Patent: Feb. 13, 2024

(54) DISPLAY DEVICE, AND METHOD FOR MANUFACTURING DISPLAY DEVICE

(71) Applicant: SHARP KABUSHIKI KAISHA, Sakai (JP)

(72) Inventor: Yoshifumi Ohta, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 405 days.

(21) Appl. No.: 17/276,700

(22) PCT Filed: Sep. 27, 2018

(86) PCT No.: PCT/JP2018/035994
§ 371 (c)(1),
(2) Date: Mar. 16, 2021

(87) PCT Pub. No.: WO2020/065837
PCT Pub. Date: Apr. 2, 2020

(65) Prior Publication Data
US 2022/0029126 A1    Jan. 27, 2022

(51) Int. Cl.
| | | |
|---|---|---|
| H10K 50/844 | (2023.01) | |
| H10K 71/00 | (2023.01) | |
| H10K 77/10 | (2023.01) | |
| H10K 102/00 | (2023.01) | |
| H10K 59/12 | (2023.01) | |

(52) U.S. Cl.
CPC .......... *H10K 50/844* (2023.02); *H10K 71/00* (2023.02); *H10K 77/111* (2023.02); *H10K 59/1201* (2023.02); *H10K 2102/311* (2023.02)

(58) Field of Classification Search
CPC .... H10K 50/844; H10K 71/00; H10K 77/111; H10K 2102/311; H10K 59/1201
See application file for complete search history.

(56) References Cited

U.S. PATENT DOCUMENTS

| | | | |
|---|---|---|---|
| 10,014,491 B2 * | 7/2018 | Park | ...................... H10K 50/844 |
| 10,770,683 B2 * | 9/2020 | Harada | ................. H10K 59/124 |
| 2014/0117330 A1 | 5/2014 | Cho et al. | |
| 2017/0069873 A1 * | 3/2017 | Kim | ........................ H10K 59/88 |
| 2017/0237038 A1 | 8/2017 | Kim et al. | |

FOREIGN PATENT DOCUMENTS

| | | |
|---|---|---|
| CN | 107452894 A | 12/2017 |
| JP | 2014086415 A | 5/2014 |

\* cited by examiner

*Primary Examiner* — Timor Karimy
(74) *Attorney, Agent, or Firm* — ScienBiziP, P.C.

(57) ABSTRACT

A display device includes the following: a base substrate; a light-emitting element on the base substrate with a TFT layer interposed therebetween, the light-emitting element forming a display region; a sealing film covering the light-emitting element and having a stack of, in sequence, first and second inorganic insulating films; a frame region surrounding the display region; a cut disposed in the frame region so as to partly cut the display region; a cut-peripheral wall disposed in the frame region between the display region and the cut, and extending along the boundary of the display region; an evaporated film between the cut-peripheral wall and the first inorganic insulating film; and an organic buffer layer disposed on a surface of the cut-peripheral wall and interposed between the first and second inorganic insulating films.

20 Claims, 11 Drawing Sheets

DISPLAY DEVICE, AND METHOD FOR MANUFACTURING DISPLAY DEVICE

TECHNICAL FIELD

The disclosure relates to a display device and a method for manufacturing the display device.

BACKGROUND ART

Attention has been recently drawn to self-emission organic EL display devices using organic electroluminescence (EL) elements, as display devices instead of liquid-crystal displays. In an organic EL display device, to prevent deterioration in an organic EL element due to contaminations of moisture, oxygen, and other things, a proposed sealing structure has a sealing film covering the organic EL element. The sealing film has a stack of organic and inorganic films. For instance, Patent Literature 1 discloses a display device that includes a stacked structure in which an inorganic film layer formed through, but not limited to, chemical vapor deposition (CVD) and an organic film layer formed through, but not limited to, an ink-jet method are arranged alternately. This display device also includes a thin sealing layer covering an organic light-emitting element.

CITATION LIST

Patent Literature

Patent Literature 1: Japanese Patent Application Laid-Open No. 2014-86415

SUMMARY

Technical Problem

The organic EL display device is required to have a cut inside its display region, where an image is displayed, in order to place a component, including a camera and a fingerprint sensor, therein. Providing a cut inside the display region of the organic EL display device can unfortunately lower the sealing capability of the sealing film.

It is an object of the disclosure to enhance the sealing capability of a sealing film in a display device having a cut inside its display region.

Solution to Problem

To achieve the object, a display device in the disclosure includes the following: a base substrate; a light-emitting element disposed on the base substrate with a TFT layer interposed between the base substrate and the light-emitting element, the light-emitting element forming a display region; a sealing film covering the light-emitting element, the sealing film having a stack of, in sequence, a first inorganic insulating film and a second inorganic insulating film; a frame region surrounding the display region; a cut disposed in the frame region so as to partly cut the display region; a cut-peripheral wall disposed in the frame region between the display region and the cut, and extending along the boundary of the display region; an evaporated film disposed between the cut-peripheral wall and the first inorganic insulating film; and an organic buffer layer disposed on a surface of the cut-peripheral wall and interposed between the first and second inorganic insulating films.

Advantageous Effect of Disclosure

The configuration according to the disclosure can enhance the sealing capability of the sealing film in the display device having the cut inside its display region.

DESCRIPTION OF EMBODIMENTS

Embodiments of the disclosure will be detailed with reference to the drawings. The disclosure is not limited to the following embodiments.

First Embodiment

Figure 1:
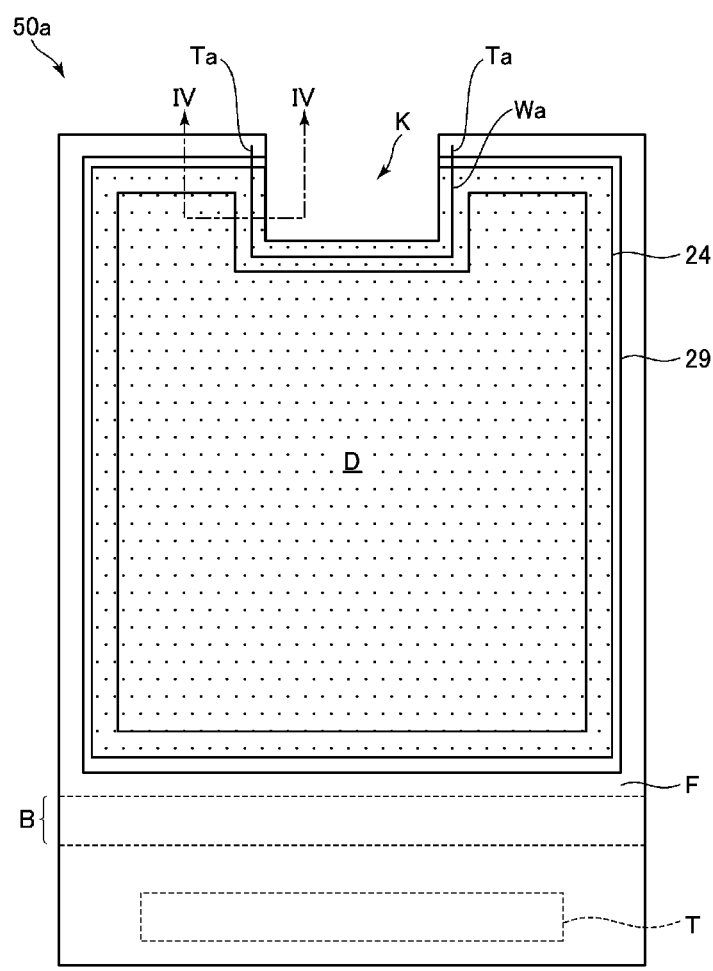
FIG. 1 is a schematic plan view of the configuration of an organic EL display device according to a first embodiment of the disclosure.
Figure 2:
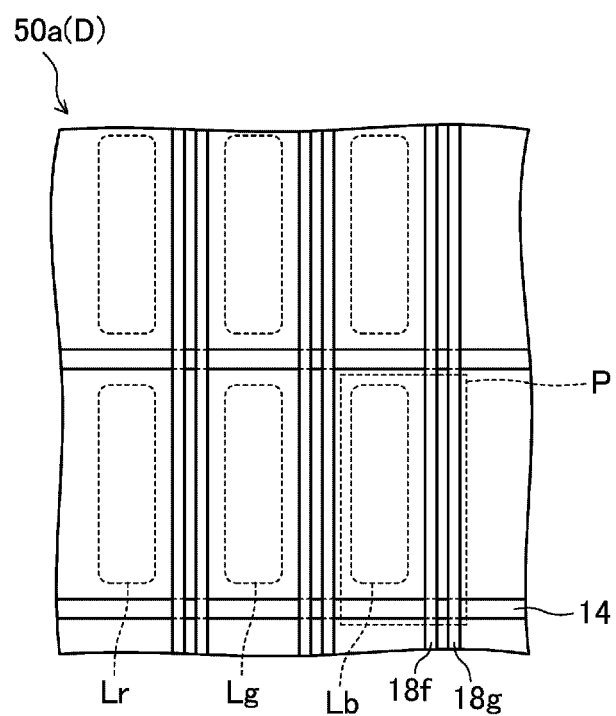
FIG. 2 is a plan view of a display region of the organic EL display device according to the first embodiment of the disclosure.
Figure 3:
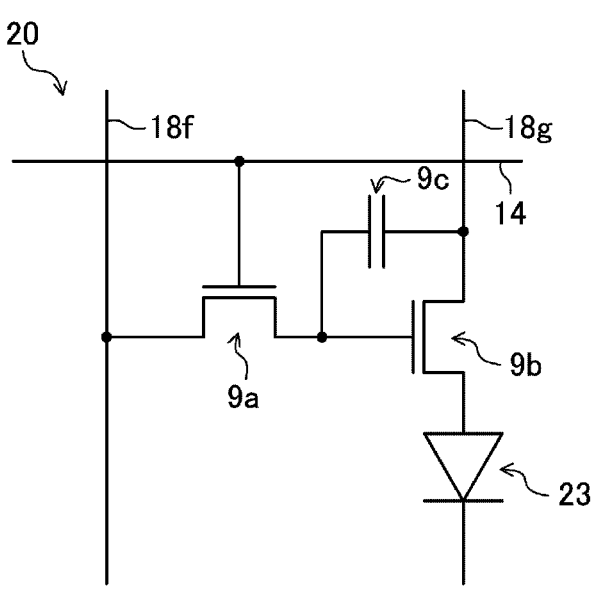
FIG. 3 is an equivalent circuit diagram of a TFT layer forming the organic EL display device according to the first embodiment of the disclosure.
Figure 4:
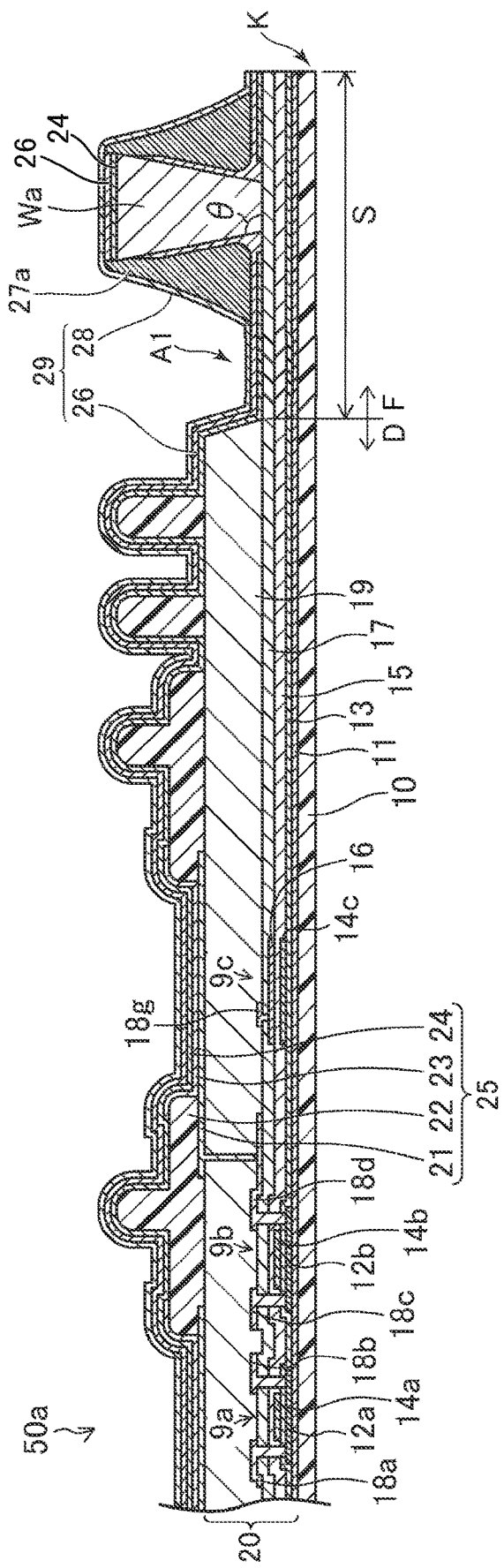
FIG. 4 is a sectional view of the organic EL display device, taken along line IV-IV in FIG. 1.
Figure 5:
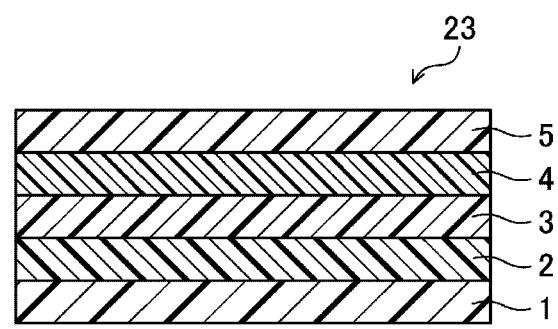
FIG. 5 is a sectional view of an organic EL layer forming the organic EL display device according to the first embodiment of the disclosure.

FIGS. 1 to 6 illustrate a display device and a method for manufacturing the same according to a first embodiment of the disclosure. Each of the following embodiments describes an organic EL display device that includes an organic EL element as an example of a display device that includes a light-emitting element. FIG. 1 is a schematic plan view of the configuration of an organic EL display device 50a according to this embodiment. FIG. 2 is a plan view of a display region D of the organic EL display device 50a. FIG. 3 is an equivalent circuit diagram of a TFT layer 20 forming the organic EL display device 50a. FIG. 4 is a sectional view of the organic EL display device 50a, taken along line IV-IV in FIG. 1. FIG. 5 is a sectional view of an organic EL layer 23 forming the organic EL display device 50a.

As illustrated in FIG. 1, the organic EL display device 50a includes the display region D having a rectangular shape and provided for image display, and includes a frame region F disposed around the display region D. The frame region F is a region of the organic EL display device 50a excluding the display region D.

The display region D is provided with an organic EL element 25, described later on, and as illustrated in FIG. 2, the region is provided with a plurality of sub-pixels P arranged in matrix. As illustrated in FIG. 2, a sub-pixel P having a red light-emitting region Lr for red gradation display, a sub-pixel P having a green light-emitting region Lg for green gradation display, and a sub-pixel P having a blue light-emitting region Lb for blue gradation display are adjacent to one another in the display region D. Three adjacent sub-pixels P having a red light-emitting region Lr, a green light-emitting region Lg, and a blue light-emitting region Lb constitute one pixel in the display region D. The display region D also has a cut K inside, as illustrated in FIG. 1.

As illustrated in FIGS. 1 and 4, a component, including a camera and a fingerprint sensor, is to be placed in the cut K. At the cut K, a cut-peripheral wall Wa is provided that protrudes in the thickness direction of a resin substrate layer 10 and extends along the boundary of the display region D, as illustrated in FIGS. 1 and 4. The cut-peripheral wall Wa is composed of a stack of, for instance, a lower layer, which is made of the same material and disposed in the same layer as a flattening film (described later on), and an upper layer, which is made of the same material and disposed in the same layer as an edge cover 22 (described later on).

The cut-peripheral wall Wa has bottom and side surfaces forming, in a cross-sectional view, an angle θ ranging about from 70 to 150 degrees. Both side surfaces of the wall form (preferably form a shape shown in FIG. 4) an inverted tapered shape in a cross-sectional view, as illustrated in FIG. 4. This better facilitates discontinuing a second electrode 24, which is an evaporated film, as described later on.

The cut K has a sidewall that is distant from the edge of the display region D by a distance S ranging about from 20 to 100 μm.

The frame region F is provided with a terminal region T at its lower end in FIG. 1. The frame region F is also provided with a bending portion B extending along one side of the display region D (the lower side in the drawing), between the display region 1) and the terminal region T. The bending portion B is 180° (U-shape) bendable about an axis in the lateral direction of the drawing. In this embodiment, the organic EL display device 50a has the bending portion B. In some embodiments, the bending portion B may be omitted.

The organic EL display device 50a includes the following components, as illustrated in FIG. 4: the resin substrate layer 10, which is a flexible base substrate; the organic EL element 25, which is a light-emitting element disposed on the resin substrate layer 10 with the thin-film-transistor (TFT) layer 20 interposed therebetween; and a sealing film 29 covering the organic EL element 25.

The resin substrate layer 10 is made of polyimide resin for instance.

The TFT layer 20 includes the following components, as illustrated in FIG. 4: a base coat film 11 disposed on the resin substrate layer 10; a plurality of first TFTs 9a, a plurality second TFTs 9b and a plurality of capacitors 9c all disposed on the base coat film 11; and a flattening film 19 disposed on the individual first TFTs 9a, second TFTs 9b and capacitors 9c. As illustrated in FIGS. 2 and 3, disposed in the TFT layer 20 are a plurality of gate lines 14 extending in parallel with one another in the lateral directions of the drawings. As illustrated in FIGS. 2 and 3, also disposed in the TFT layer 20 are a plurality of source lines 18f extending in parallel with one another in the longitudinal direction of the drawings. As illustrated in FIGS. 2 and 3, also disposed in the TFT layer 20 are a plurality of power-source lines 18g adjacent to the respective source lines 18f and extending in parallel with one another in the longitudinal directions of the drawings. In the TFT layer 20, each sub-pixel P has the first TFT 9a, the second TFT 9b, and the capacitor 9c, as illustrated in FIG. 3. The pixel circuit in FIG. 3 is illustrative and not restrictive.

The base coat film 11 is composed of an inorganic insulating monolayer film of, for instance, silicon nitride, silicon oxide or silicon oxide nitride, or is composed of an inorganic insulating laminated film of these materials.

In each sub-pixel P, the first TFT 9a is electrically connected to the corresponding gate line 14 and source line 18f, as illustrated n FIG. 3. The first TFT 9a includes the following components, as illustrated in FIG. 4: a semiconductor layer 12a disposed in the form of an island on the base coat film 11; a gate insulating film 13 covering the semiconductor layer 12a, a gate electrode 14a partly overlapping, on the gate insulating film 13, the semiconductor layer 12a; a first interlayer insulating film 15 and a second interlayer insulating film 17 sequentially disposed over the gate electrode 14a; and a source electrode 18a and a drain electrode 18b spaced away from each other on the second interlayer insulating film 17. The gate insulating film 13, the first interlayer insulating film 15, and the second interlayer insulating film 17 are composed of an inorganic insulating monolayer film of, for instance, silicon nitride, silicon oxide or silicon oxide nitride, or is composed of an inorganic insulating laminated film of these materials.

In each sub-pixel P, the second TFT 9b is connected to the corresponding first TFT 9a and power-source line 18g, as illustrated in FIG. 3. The second TFT 9b includes the following components, as illustrated in FIG. 4: a semiconductor layer 12b in the form of an island on the base coat film 11; the gate insulating film 13 covering the semiconductor layer 12b; a gate electrode 14b partly overlapping, on the gate insulating film 13, the semiconductor layer 12b; the first interlayer insulating film 15 and the second interlayer insulating film 17 sequentially disposed over the gate electrode 14b; and a source electrode 18c and a drain electrode 18d spaced away from each other on the second interlayer insulating film 17.

Although the first TFTs 9a and the second TFTs 9b are top-gate TFTs in this embodiment by way of example, these TFTs may be bottom-gate TFTs.

In each sub-pixel P, the capacitor 9c is connected to the corresponding first TFT 9a and power-source line 18g, as illustrated in FIG. 3. The capacitor 9c includes the following components, as illustrated in FIG. 4: a lower conductive layer 14c disposed in the same layer and made of the same material as the gate electrodes: the first interlayer insulating film 15 covering the lower conductive layer 14c; and an upper conductive layer 16 overlapping, on the first interlayer insulating film 15, the lower conductive layer 14c. The upper conductive layer 16 is connected to the power-source line 18g via a contact hole disposed in the second interlayer insulating film 17, as illustrated in FIG. 4.

The flattening film 19 is made of colorless and transparent organic resin such as polyimide resin.

The organic EL element 25 includes the following components sequentially disposed on the flattening film 19, as illustrated in FIG. 4: a plurality of first electrodes 21, an edge cover 22, a plurality of organic EL layers 23, and the second electrode 24.

As illustrated in FIG. 4, the first electrodes 21 are arranged in matrix on the flattening film 19 as reflective electrodes (anodes) so as to correspond to the plurality of sub-pixels P. Each first electrode 21 is connected to the drain electrode 18d of each second TFT 9b through a contact hole disposed in the flattening film 19, as illustrated in FIG. 4. The first electrodes 21 are capable of injecting holes (positive holes) into the organic EL, layers 23. The first electrodes 21 are more preferably made of material having a large work function in order to improve the efficiency of hole injection into the organic layers 23. The first electrodes 21 are made of metal, including silver (Ag), aluminum (Al), vanadium (V), cobalt (Co), nickel ((Ni), tungsten (W), gold (Au), calcium (Ca), titanium (Ti), yttrium (Y), sodium (Na), ruthenium (Ru), manganese Mn), indium (In), magnesium (Mg), lithium (Li), ytterbium (Yb), and lithium fluoride (LiF). Alternatively, the first electrodes 21 may be made of, for instance, alloy of magnesium (Mg) and copper (Cu), alloy of magnesium (Mg) and silver (Ag), alloy of sodium (Na) and potassium (K), alloy of astatine (At) and astatine oxide ($AtO_2$), alloy of lithium (Li) and aluminum (Al), alloy of lithium (Li) calcium (Ca) and aluminum (Al), or alloy of lithium fluoride (LiF), calcium (Ca) and aluminum (Al). Alternatively, the first electrodes 21 may be made of conductive oxide, such as tin oxide (SnO), zinc oxide (ZnO), indium tin oxide (ITO), or indium zinc oxide (IZO). Alternatively, the first electrodes 21 may be composed of a stack of multiple layers made of the above materials. Here, examples of a material having a large work function include an indium tin oxide (ITO) and an indium zinc oxide (IZO).

The edge cover 22 is provided in lattice and covers the edge of each first electrode 21, as illustrated in FIG. 4. The edge cover 22 is an organic film made of, for instance, polyimide resin, acrylic resin, polysiloxane resin, or novolak resin.

The organic EL layers 23 are disposed on the individual first electrodes 21 and arranged in matrix so as to correspond to the plurality of sub-pixels, as illustrated in FIG. 4. Each organic EL layer 23 includes the following layers sequentially disposed on the first electrode 21, as illustrated in FIG. 5: a hole injection layer 1, a hole transport layer 2, a light-emitting layer 3, an electron transport layer 4, and an election injection layer 5. The hole in layer 1, the hole transport layer 2, the light-emitting layer 3, the electron transport layer 4, and the electron injection layer 5 are evaporated films formed through vacuum evaporation for instance.

The hole injection layer is also called an anode buffer layer, and is capable of bringing the energy levels of the first electrode 21 and organic EL layer 23 close to each other to improve the efficiency of hole injection from the first electrode 21 into the organic EL layer 23. The hole injection layer 1 is composed of, for instance, a triazole derivative, an oxadiazole derivative, an imidazole derivative, a polyarylalkane derivative, a pyrazoline derivative, a phenylenediamine derivative, an oxazole derivative, a styrylanthracene derivative, a fluorenone derivative, a hydrazone derivative, or a stilbene derivative.

The hole transport layer 2 is capable of improving the efficiency of hole transport from the first electrode 21 to the organic EL layer 23. Examples of the material of the hole transport layer 2 include a porphyrin derivative, an aromatic tertiary amine compound, is styrylamine derivative, a polyvinylcarbazole, poly-p-phenylenevinylene, a polysilane, triazole derivative, an oxadiazole derivative, an imidazole derivative, a polyarylalkane derivative, a pyrazoline derivative, a pyrazolone derivative, a phenylenediamine derivative, an arylamine derivative, an amine-substituted chalcone derivative, an oxazole derivative, a styrylanthracene derivative, a fluorenonefluorenone derivative, a hydrazone derivative, a stilbene derivative, hydrogenated amorphous silicon, hydrogenated amorphous silicon carbide, zinc sulfide, and zinc selenide.

The light-emitting layer 3 is a region where holes and electrons are respectively injected from the first and second electrodes 21 and 24 applied with voltage, and is a region where the holes and electrons rejoin. The light-emitting layer 3 is made of material having high efficiency of light emission. Examples of the material of the light-emitting layer 3 include a metal oxinoid compound [8-hydroxyquinoline metal complex], a naphthalene derivative, an anthracene derivative, a diphenylethylene derivative, a vinyl acetone derivative, a triphenylamine derivative, a butadiene derivative, a coumarin derivative, a benzoxazole derivative, an oxadiazoic derivative, an oxazole derivative, a benzimidazole derivative, a thiadiazole derivative, a benzthiazole derivative, a styryl derivative, a styrylamine derivative, a bisstyrylbenzene derivative, a trisstyrilbenzene derivative, a perylene derivative, a perynone derivative, an aminopyrene derivative, a pyridine derivative, a rhodamine derivative, an acridine derivative, phenoxazone, a quinacridone derivative, rubrene, poly-p-phenylenevinylene, and polysilane.

The electron transport layer 4 is capable of moving electrons to the light-emitting layer 3 efficiently. The electron transport layer 4 is composed of an organic compound, including an oxadiazole derivative, a triazole derivative, a benzoquinone derivative, a naphthoquinone derivative, an anthraquinone derivative, a tetracyanoanthraquinodimethane derivative, a diphenoquinone derivative, a fluorenone derivative, a silole derivative, and a metal oxinoid compound.

The electron injection layer 5 is capable of bringing the energy levels of the second electrode 24 and organic EL layer 23 close to each other to improve the efficiency of electron injection from the second electrode 24 into the organic EL layer 23. This function can lower voltage for driving the organic EL element 25. The electron injection layer 5 is also called a cathode buffer layer. Herein, examples of the material of the electron injection layer 5 include an inorganic alkali compound (e.g., LiF or lithium fluoride, $MgF_2$ or magnesium fluoride, $CaF_2$ or calcium fluoride, $SrF_2$ or strontium fluoride, and $BaF_2$ or barium fluoride), an aluminum oxide ($Al_2O_3$), and a strontium oxide (SrO).

The second electrode 24 (denoted by dots in FIG. 1) covers the individual organic EL layers 23 and the edge cover 22 and serves as a common electrode (cathode), as illustrated in FIGS. 1 and 4. The second electrode 24 (denoted by the dots in the drawing) is also disposed around the cut K, as illustrated in FIG. 1. The second electrode 24 is capable of injecting electrons into the organic EL layers 23. The second electrode 24 is more preferably made of material having a small work function, in order to improve the efficiency of electron injection into the organic EL layers 23. The second electrode 24 is an evaporated film through vacuum evaporation for instance. Herein, examples of the material of the second electrode 24 include silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru) manganese (Mn), indium (In), magnesium (Mg), lithium (Li), ytterbium (Yb), and lithium fluoride (LiF). Alternatively, the second electrode 24 may be made of, for instance, alloy of magnesium (Mg) and copper (Cu), alloy of magnesium (Mg) and silver (Ag), alloy of sodium (Na) and potassium (K), alloy of astatine (At) and astatine oxide ($AtO_2$), alloy of lithium (Li) and aluminum (Al), alloy of lithium (Li), calcium (Ca) and aluminum (Al), or alloy of lithium fluoride (LiF), calcium (Ca) and aluminum (Al). Alternatively, the second electrode 24 may be made of conductive oxide, such as tin oxide (SnO), zinc oxide (ZnO), indium tin oxide (ITO), or indium zinc oxide (IZO). Alternatively, the second electrode 24 may be composed of a stack of multiple layers made of the above materials. Examples of a material having a small work function include magnesium (Mg), lithium (Li), lithium fluoride (LiF), magnesium (Mg)-copper (Cu), magnesium (Mg)-silver (Ag), sodium (Na)-potassium (K), lithium (Li)-aluminum (Al), lithium (Li)-calcium (Ca)-aluminum (Al), and lithium fluoride (LiF)-calcium (Ca)-aluminum (Al).

Figure 6:
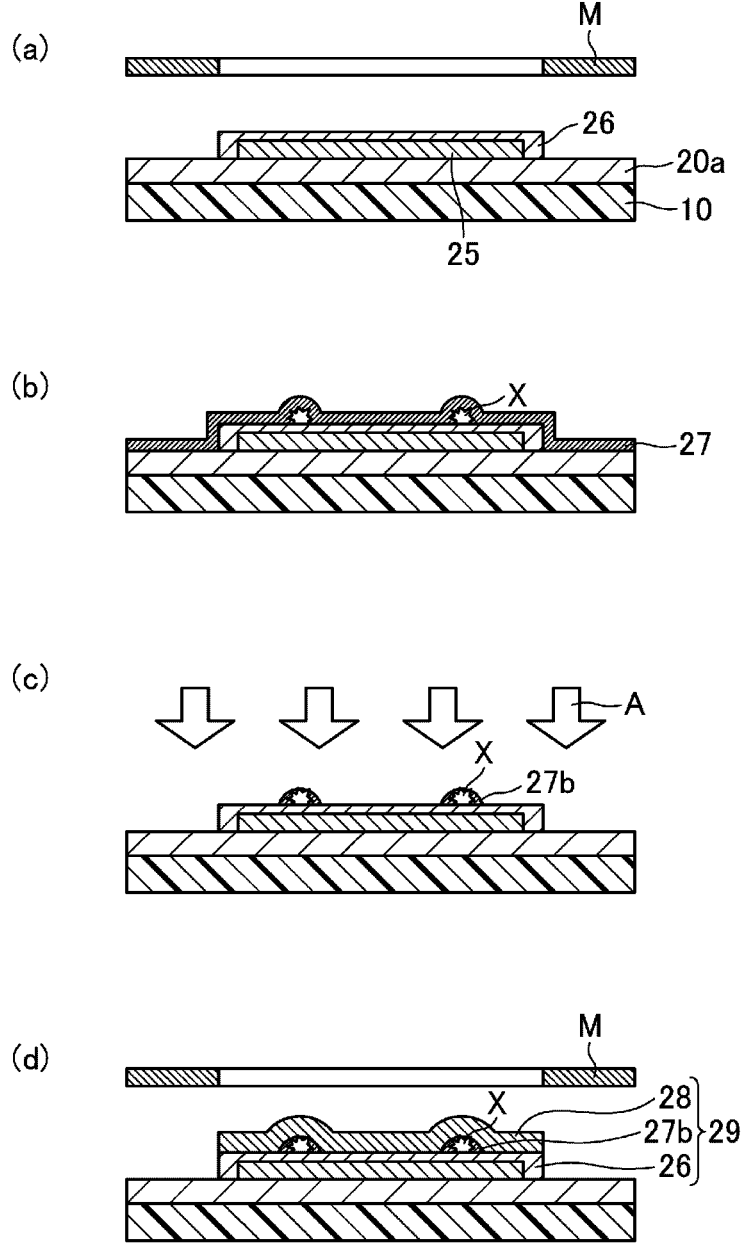
FIG. 6 illustrates, in a sectional view, a step of sealing-film formation included in a method for manufacturing the organic EL display device according to the first embodiment of the disclosure.

The sealing film 29 includes the following components, as illustrated in FIG. 4: a first inorganic insulating film 26 covering the second electrode 24; an organic buffer layer 27a and an organic buffer layer 27b, which is shown in FIG. 6(*d*) described later on, both disposed on the first inorganic insulating film 26; and a second inorganic insulating film 28 covering, on the first inorganic insulating film 26, the organic buffer layers 27a and 27b. The sealing film 29 is capable of protecting the organic layers 23 from moisture and oxygen. The first inorganic insulating film 26 and the second inorganic insulating film 28 are made of inorganic material, such as silicon oxide ($SiO_2$), aluminum oxide ($Al_2O_3$), silicon nitride (SiNx, where x is a positive number; an example of silicon nitride is $Si_3N_4$ or trisilicon tetranitride), or silicon carbonitride (SiCN). The organic buffer layers 27a and 27b are made of organic material, such as acrylate, polyurea, parylene, polyimide, or polyamide. As illustrated in FIG. 4, the organic buffer layer 27a is interposed between the first inorganic insulating film 26 and the second inorganic insulating film 28, on both side surfaces of the surface of the cut-peripheral wall Wa. The upper part of the organic buffer layer 27a is in contact with both side surfaces of the cut-peripheral wall Wa, as illustrated in FIG. 4, because the first inorganic insulating film 26 is discontinuous due to the cross-sectional shape of the cut-peripheral wall Wa. Moreover, the second electrode 24 is disposed not only in the display region D, but also in the frame region F, as illustrated in FIG. 4, and in the frame region F, the second electrode 24 is discontinuous due to the cross-sectional shape of the cut-peripheral wall Wa. The second electrode 24 is thus disposed also between the upper surface of the cut-peripheral wall Wa, and the first inorganic insulating film 26. Moreover, the organic buffer layer 27b is disposed on the surfaces of foreign substances X adhering to the first inorganic insulating film 26, as illustrated in FIG. 6(*d*).

The second electrode 24, an evaporated film, is disposed across the cut-peripheral wall Wa, as illustrated in FIGS. 1 and 4. To be specific, the second electrode 24 is disposed over the cut-peripheral wall Wa, from a location close to the display region D to the cut K. In addition, the second electrode 24 extends from a location close to the display region D to the cut-peripheral wall Wa, extends on the upper snake of the cut-peripheral wall Wa, and extends from the cut-peripheral wall Wa to the cut K, illustrated in FIG. 4. That is, the second electrode 24 is discontinued by the cut-peripheral wall Wa. This can avoid electrical connection between a region around the cut K and the display region D, and avoid transmission of a degradation due to moisture and other causes. It is noted that this evaporated film across the cut-peripheral wall Wa may be the hole injection layer 1, the hole transport layer 2, the light-emitting layer 3, the electron transport layer 4, and/or the electron injection layer 5.

The sealing film 29 is disposed across the cut-peripheral wall Wa, illustrated in FIGS. 1 and 4. To be specific, the sealing film 29 is disposed over the cut-peripheral wall Wa, from a location close to the display region D to the cut K. In addition, the second inorganic insulating film 28 of the sealing film 29 continuously extends across the cut peripheral wall Wa, as illustrated in FIG. 4. This can enhance the sealing capability of the sealing film 29 even when the cut-peripheral wall Wa is provided.

The cut-peripheral wall Wa intersects with the end of the second electrode 24, which is an evaporated film, as illustrated in FIG. 1. That is, the cut-peripheral wall Wa has ends Ta located outside the perimeter of the second electrode 24. This splits the second electrode 24 into a part close to the cut K and a part close to the display region D with certainty.

The cut-peripheral wall Wa also intersects with the end of the sealing film 29 in the example of FIG. 1. That is, the ends Ta of the cut-peripheral wall Wa are located outside the perimeter of the sealing film 29. This configuration enables the cut-peripheral wall Wa to block crack propagation, avoiding a crack from approaching the display region D, even when such a crack occurs in the sealing film 29 around the cut K. This can prevent moisture ingress into the organic EL element 25.

In this embodiment, the sealing film 29 and a third inorganic insulating film are in contact in a region between the flattening film 19 and the cut-peripheral wall Wa. To be specific, the first inorganic insulating film 26 and the second interlayer insulating film 17, which is the third inorganic insulating film, are in contact in a region A1, as illustrated in FIG. 4. The flattening film 19 is accordingly sealed by the first inorganic insulating film 26 and the second interlayer insulating film 17. This can prevent moisture ingress from the flattening film 19 into the organic EL element 25. It is noted that the third inorganic insulating film needs to be an inorganic insulating film of the TFT layer 20, and that the third inorganic insulating film may be, for instance, the base coat film 11, the gate insulating film 13, or the first interlayer insulating film 15 instead of the second interlayer insulating film 17.

The organic EL display device 50a is designed to display an image by, in each sub-pixel, inputting a gate signal to the first TFT 9a via the gate line 14 to turn on the first TFT 9a, applying a predetermined voltage corresponding to a source signal to the gate electrode 14b of the second TFT 9b and to the capacitor 9c via the source line 18f to define the level of a current coming from the power-source line 18g on the basis of the gate voltage of the second TFT 9b, and supplying the defined current to the organic EL layer 23 to cause the light-emitting layer 3 of the organic EL layer 23 to emit light. In the organic EL display device 50a, the gate voltage of the second TFT 9b is maintained by the capacitor 9c even when the first TFT 9a is turned off; hence, the light-emitting layer 3 keeps light emission until a gate signal in the next frame is input.

A method for manufacturing the organic EL display device 50a according to this embodiment will be described with reference to FIG. 6. FIG. 6 illustrates, in a sectional view, a step of sealing-film formation in the method for manufacturing the organic EL display device 50a. FIGS. 6(*a*), 6(*b*), 6(*c*), and 6(*d*) respectively illustrate, in sectional views, a step of forming a first inorganic insulating film, a step of forming an organic film, an ashing step, and a step of forming a second inorganic insulating film. The method for manufacturing the organic EL display device 50a according to this embodiment includes the following: a step of forming a TFT layer; a step of forming a light-emitting element including a step of forming a cut-peripheral wall; the step of forming the sealing film including the step of forming the first inorganic insulating film, the step of forming the organic film, the ashing step, and the step of forming the second inorganic insulating film; a flexing step; and a step of forming a cut.

Step of Forming TFT Layer

The TFT layer 20 is formed by forming, through a well-known method, the base coat film 11, the first TFTs 9a, the second TFTs 9b, the capacitors 9c, and the flattening film 19 onto a surface of the resin substrate layer 10 disposed on a glass substrate for instance.

Step of Forming Light-Emitting Element (Step of Forming Evaporated Film)

The method for manufacturing the display device 50a according to this embodiment includes a step of forming an evaporated film onto a substrate provided with the cut-peripheral wall Wa. The step of forming the evaporated film is performed between the step of forming the cut-peripheral wall and the step of forming the sealing film, both of which will be described later on. The step of forming the evaporated film includes a step of forming an organic film over a first inorganic insulating film through evaporation. To be specific, the organic EL element 25 is formed by forming, through a well-known method, the first electrodes 21, the edge cover 22, the organic EL layers 23 (i.e., the hole in layers 1, the hole transport layers 2, the light-emitting layers 3, the electron transport layers 4, and the electron injection layers 5), and the second electrode 24 onto the TFT layer 20 as formed in the step of forming the TFT layer. The cut-peripheral wall Wa is formed by, for instance, collective or two-stage patterning (exposure, development, and baking) of a photosensitive resin film used for forming the flattening film 19 in the step of forming the TFT layer, and a photosensitive resin film used for forming the edge cover 22 in the step of forming the light-emitting element. This process step is the step of forming the cut-peripheral wall.

Step of Forming Sealing Film

Firstly, as illustrated in FIG. 6(a), which illustrates the step of forming the first inorganic insulating film, the first inorganic layer 26 is formed by forming, through plasma CDV using a mask M, an about 1000 nm thick inorganic insulating film, such as a silicon nitride film, onto the substrate surface provided with the organic EL element 25 as formed in the step of forming the fight-emitting element.

Subsequently, as illustrated in FIG. 6(b), which illustrates the step of forming the organic film, an about 200 nm, thick organic film 27 made of organic material, such as acrylate, is formed all over the substrate surface provided with the first inorganic layer 26 through, for instance, vacuum evaporation.

Then, as illustrated in FIG. 6(c) which illustrates the ashing step, the organic film 27 undergoes aching using plasma A to form the organic buffer layers 27a (see FIG. 4) and 27b. Herein, although mostly removed as a result of the ashing using plasma A, the organic film 27 remains on both side surfaces of the cut-peripheral wall Wa and the surfaces of the foreign substances X, thus forming the organic buffer layers 27a and 27b.

Then, as illustrated in FIG. 6(d), which illustrates the step of forming the second inorganic insulating film, the substrate surface provided with the organic buffer 27a and 27b undergoes plasma CVD using a mask M to form an about 500 nm thick inorganic insulating film, such as a silicon nitride film, thus forming the second inorganic insulating film 28 that overlaps the first inorganic insulating film 26, thus forming the sealing film 29.

Flexing Step

The substrate provided with the sealing film 29 as formed in the step of forming the sealing film undergoes laser-light scanning-and-irradiation from the glass substrate to remove the glass substrate from the resin substrate layer 10.

Step of Forming Cut

The inside of the cut-peripheral wall Wa in the substrate with the glass substrate removed therefrom in the flexing step undergoes, for instance, laser light scanning-and-irradiation to form the cut K.

The organic EL display device 50a according to this embodiment can be manufactured through these process steps.

As described above in connection with the organic EL display device 50a and the method for manufacturing the same according to this embodiment, the step of forming the cut-peripheral wall includes forming in the cut K within the display region D, the cut-peripheral wall Wa protruding in the thickness direction of the resin substrate layer 10 and extending along the boundary of the display region D. In addition, the step of forming the sealing film includes forming the organic buffer layer 27b onto both side surfaces of the cut-peripheral wall Wa, with the first inorganic insulating film 26 interposed therebetween, followed by forming the second inorganic insulating film 28. In the step of forming the sealing film, the organic film 27 formed over the first inorganic insulating film 26 through evaporation undergoes ashing to form, in the cut K, the organic buffer layer 27a onto both side surfaces of the cut-peripheral wall Wa with the first inorganic insulating film 26 interposed therebetween, and to form, in the display region D mainly, the organic buffer layer 27b onto the surfaces of the foreign substances X adhering to the first inorganic insulating film 26. Hence, the sealing structure consisting of the sealing film 29 having, in the display region D, a stack of the first inorganic insulating film 26, the organic buffer layer 27b and the second inorganic insulating film 28 is discontinued by the cut-peripheral wall Wa in the cut K. In the sealing structure discontinued by the cut-peripheral wall Wa in the cut K, the organic buffer layer 27a on both side surfaces of the cut-peripheral wall Wa enables the second inorganic insulating film 28 to sufficiently cover the first inorganic insulating film 26. This can enhance, in the organic EL display device 50a, the sealing capability of the sealing film 29 even when the cut K is disposed within the display region D.

In the organic EL display device 50a and the method for manufacturing the same, the angle θ, formed by the bottom and side surfaces of the cut-peripheral wall Wa in a cross-sectional view, ranges from 70 to 150 degrees. The evaporated films, such as the second electrode 24, are hence discontinuous due to the cross-sectional shape of the cut-peripheral wall Wa. This can enhance the sealing capability of the sealing film 29 even when the upper part of the organic buffer layer 27a is in contact with the cut-peripheral wall Wa, because the second inorganic insulating film 28 is formed over the organic buffer layer 27a in the step of forming the second inorganic insulating film, which is included in the step of forming the sealing film. Furthermore, the evaporated films, such as the second electrode 24, are discontinued by the cut-peripheral wall Wa. This enables the evaporated films to be patterned into a shape excluding the cut K, without using a mask having a complex structure along the cut K, and can prevent moisture ingress into the organic EL element 25 via the evaporated films.

Figure 7:
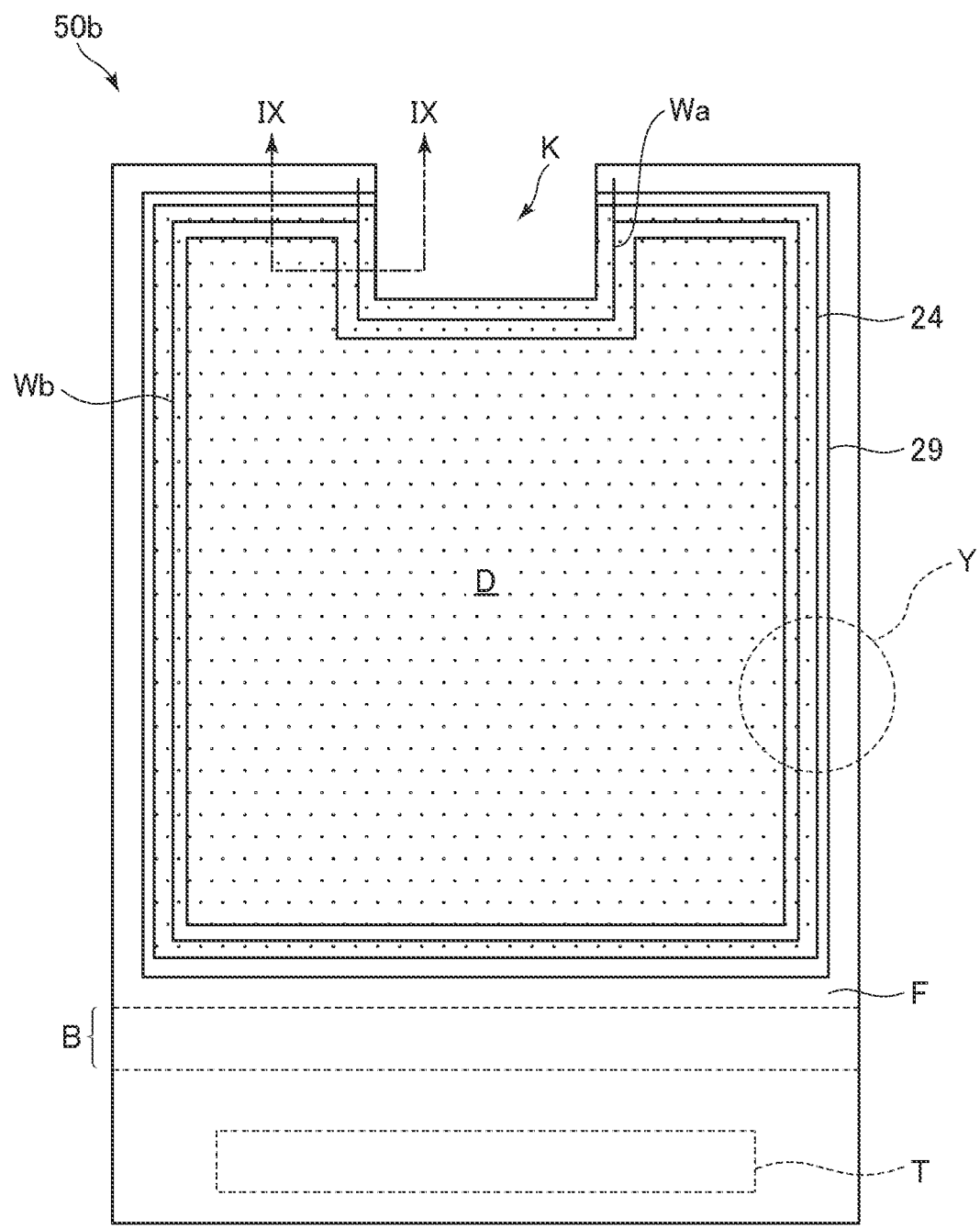
FIG. 7 is a schematic plan view of the configuration of an organic EL display device according to a second embodiment of the disclosure.
Figure 8:
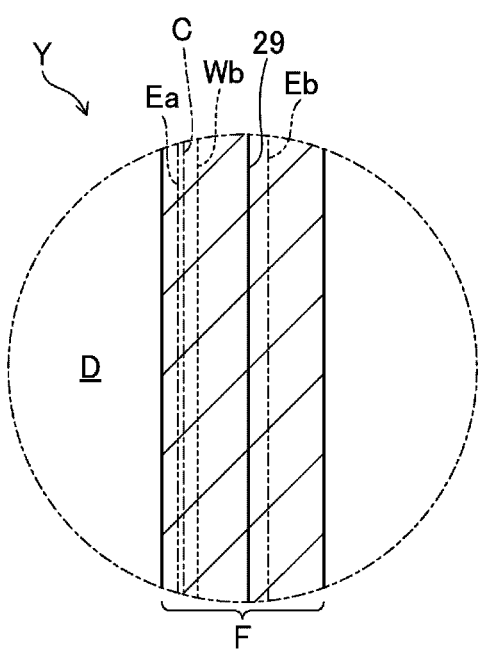
FIG. 8 is an enlarged plan view of a region Y in FIG. 7.
Figure 9:
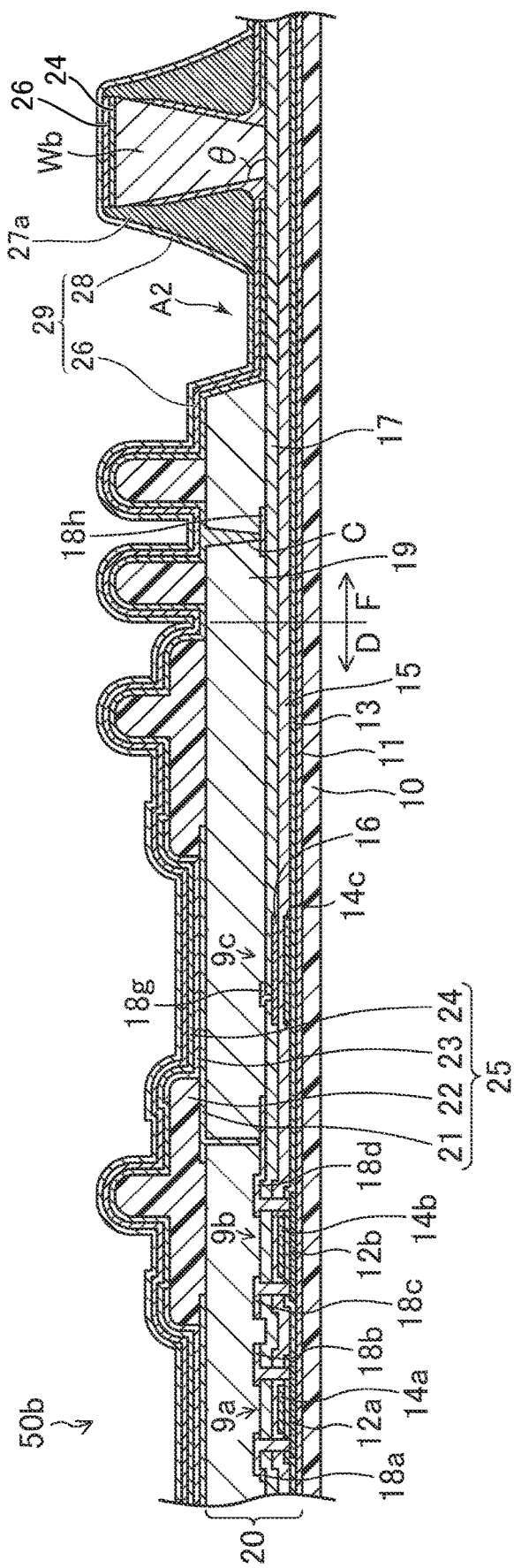
FIG. 9 is a sectional view of the organic EL display device, taken along line IX-IX in FIG. 7.

FIGS. 7 to 9 illustrate a display device and a method for manufacturing the same according to a second embodiment of the disclosure. FIG. 7 is a schematic plan view of the configuration of an organic EL display device 50b according to this embodiment. FIG. 8 is an enlarged plan view of a region Y in FIG. 7. FIG. 9 is a sectional view of the organic EL display device 50b, taken along line IX-IX in FIG. 7. In the following embodiments, the same components as those in FIGS. 1 to 6 are denoted by the same signs and will not be elaborated upon.

In the first embodiment, the organic EL display device 50a has the cut-peripheral wall Wa in the cut K. In the present embodiment, the organic EL display device 50b has the cut-peripheral wall Wa in the cut K, and has an outer wall Wb in the frame region F.

The organic EL display device 50b includes the rectangular display region D and the frame region F disposed around the display region D, as illustrated in FIG. 7.

In the frame region F, the outer wall Wb in the form of a rectangular frame protrudes in the thickness direction of the resin substrate layer 10 and extends along the boundary of the display region D, a illustrated in FIGS. 7 and 9. The outer wall Wb is composed of a stack of, for instance, a lower layer which is made of same material and disposed in the same layer as the flattening film 19, and an upper layer, which is made of the same material and disposed in the same layer as the edge cover 22. The outer wall Wb has bottom and side surfaces forming, in a cross-sectional view, an angle θ ranging about from 70 to 150 degrees. Both side surfaces of the wall form an inverted tapered shape in a cross-sectional view, as illustrated in FIG. 9. As illustrated in FIGS. 8 and 9, the flattening film 19 has, in the frame region F, a slit C for establishing electrical continuity between the second electrode 24 and a source conductive layer (wire) 18h.

The evaporated films, including the second electrode 24, which are formed through the vacuum evaporation described in the first embodiment, and the first inorganic insulating film 26 are discontinuous in the frame region F due to the cross-sectional shape of the outer wall Wb. The evaporated films are formed using a fine metal mask (FMM) that can be patterned per sub-pixel, or a common metal mask (CMM) that can be patterned per panel. An example of an evaporated film formed using an FMM is the light-emitting layer 3. Moreover, examples of a common evaporated film formed using a CMM include the hole injection layer 1, the hole transport layer 2, the electron transport layer 4, the electron injection layers 5, an electron block layer, a hole block layer, and the second electrode 24. A common evaporated film formed using a CMM is of high electrical resistance when interposed between the second electrode 24 and the source conductive layer 18h; hence, a CMM for forming the second electrode 24 needs to have a larger opening than CMMs for forming common evaporated films other than the second electrode 24. Accordingly, the ends of the common evaporated films, other than the second electrode 24, formed using the CMMs are denoted by a sign Ea in FIG. 8, and the end of the second electrode 24 and the end of the evaporated film formed using the FMM are denoted by a sign Eb in FIG. 8. At this time, the outer wall Wb electrically insulates the second electrode 24 disposed outside the sealing film 29 from the second electrode 24 disposed in the display region D. It is noted that in FIG. 8, the ends of the evaporated films other than the second electrode 24, formed using the CMMs and the end of the evaporated film formed using the FMM may be denoted by the sign Ea, and that the end of the second electrode 24 may be denoted by the sign Eb. It is also noted that the end of the sealing film may be denoted by the sign Eb, and that the end of the second electrode may be denoted by a numeral 29.

The organic EL display device 50b includes the following components, as illustrated in FIG. 9: the resin substrate layer 10, the organic EL element 25, which is a light-emitting element, disposed on the resin substrate layer 10 with the TFT layer 20 interposed therebetween; and the sealing film 29 covering the organic EL element 25.

The sealing film 29 includes the following components, as illustrated in FIG. 9: the first inorganic insulating film 26 covering the second electrode 24; the organic buffer layers 27a and 27b and an organic buffer layer 27c all disposed on the first inorganic insulating film 26; and the second inorganic insulating film 28 covering, on the first inorganic insulating film 26, the organic buffer layers 27a, 27b, and 27c. The sealing film 29 is capable of protecting the organic EL layers 23 from moisture and oxygen. The organic buffer layer 27c is made of organic material, such as acrylate, polyurea, parylene, polyimide or polyamide. The organic buffer layer 27c is disposed on both side surfaces of the surface of the outer wall Wb in the frame region F so as to be interposed between the first inorganic insulating film 26 and the second inorganic insulating film 28, as illustrated in FIG. 9. The upper part of the organic buffer layer 27c is in contact with both side surfaces of the outer wall Wb, as illustrated in FIG. 9, because the first inorganic insulating film 26 is discontinuous due to the cross-sectional shape of the outer wall Wb. The second electrode 24 is disposed not only in the display region D, but also in the frame region F, as illustrated in FIG. 9, and in the frame region F, the second electrode 24 is discontinuous due to the cross-sectional shape of the outer wall Wb. The second electrode 24 is thus disposed also between the upper surface of the outer wall Wb and the first inorganic insulating film 26, and disposed outside the sealing film 29 as well.

Like the organic EL display device 50a according to the first embodiment, the organic EL display device 50b is flexible, and is designed to display an image when the light-emitting layer 3 of the organic EL layer 23 in each sub-pixel P emits light, as appropriate, via the first TFT 9a and the second TFT 9b.

The outer wall Wb and the cut-peripheral wall Wa according to this embodiment continuously extend each other, as illustrated in FIG. 7. The organic EL display device 50b according to this embodiment can be manufactured using the method for manufacturing live organic EL display device 50a according to the first embodiment, with the exception that the method needs to include forming the outer wall Wb at the same time as the cut-peripheral wall Wa.

In this embodiment, the sealing film 29 and a third inorganic insulating film are in contact in a region between the flattening film 19 and the outer wall Wb. To be specific, the first inorganic insulating film 26 and the second interlayer insulating film 17, which is the third inorganic insulating film, are in contact in the region between the flattening film 19 and the outer wall Wb. The flattening film 19 is accordingly sealed by the first inorganic insulating film 26 and the second interlayer insulating film 17. This can prevent moisture ingress from the flattening film 19 into the organic EL element 25. It is noted that the third inorganic insulating film needs to be an inorganic insulating film of the TFT layer 20, and that the third inorganic insulating film may be, for instance, the base coat film 11, the gate insulating film 13, or the first interlayer insulating film 15 instead of the second interlayer insulating film 17.

As described above in connection with the organic EL display device 50b and the method for manufacturing the same according to this embodiment, the step of forming the cut-peripheral wall includes forming, in the cut K within the display region D, the cut-peripheral wall Wa protruding in the thickness direction of the resin substrate layer 10 and extending along the boundary of the display region D. In addition, the step of forming the sealing film includes forming the organic buffer layer 27b onto both side surfaces of the cut-peripheral wall Wa, with the first inorganic insulating film 26 interposed therebetween, followed by forming the second inorganic insulating film 28. In the step of forming the sealing film, the organic film 27 formed over the first inorganic insulating film 26 through evaporation undergoes ashing to form, in the frame region F, the organic buffer layer 27a onto both side surfaces of the cut-peripheral wall Wa with the first inorganic insulating film 26 interposed therebetween, and to form, in the display region D mainly, the organic buffer layer 27b onto the surfaces of the foreign substances X adhering to the first inorganic insulating film 26. Hence, the sealing structure consisting of the sealing film 29 having, in the display region D, a stack of the first inorganic insulating film 26, the organic buffer layer 27b and the second inorganic insulating film 28 is discontinued by the cut-peripheral wall Wa in the frame region F. In the sealing structure discontinued by the cut-peripheral wall Wa in the frame region F, the organic buffer layer 27a on both side surfaces of the cut-peripheral wall Wa enables the second inorganic insulating film 28 to sufficiently cover the first inorganic insulating film 26. This can enhance, in the organic EL display device 50b, the sealing capability of the sealing film 29 even when the cut K is disposed within the display region D.

In the organic EL display device 50b and the method for manufacturing the same according to this embodiment, an angle formed by the bottom and side surfaces of the cut-peripheral wall Wa and outer wall Wb in a cross-sectional view is equal to or greater than 70 degrees. The evaporated films, including the second electrode 24, and the first inorganic insulating film 26 are hence discontinuous due to the cross-sectional shapes of the cut-peripheral wall Wa and outer wall Wb. This can enhance the sealing capability of the sealing film 29 even when the upper parts of the organic buffer layers 27a and 27c are respectively in contact with the cut-peripheral wall Wa and the outer wall Wb, because the second inorganic insulating film 28 is formed over the first inorganic insulating film 26 and the organic buffer layers 27a and 27c in the step of forming the second inorganic insulating film, which is included in the step of forming the sealing film. Furthermore, the evaporated films, such as the second electrode 24, are discontinued by the cut-peripheral wall Wa and the outer wall Wb. This enables the evaporated films to be patterned into a shape excluding the cut K, without using a mask having a complex structure along the cut K, and can prevent moisture ingress into the organic EL element 25 via the evaporated films.

In the organic EL display device 50b and the method for manufacturing the same according to this embodiment, the evaporated films, such as the second electrode 24, are discontinued by the outer wall Wb, thereby narrowing the frame region F.

Third Embodiment

Figure 10:
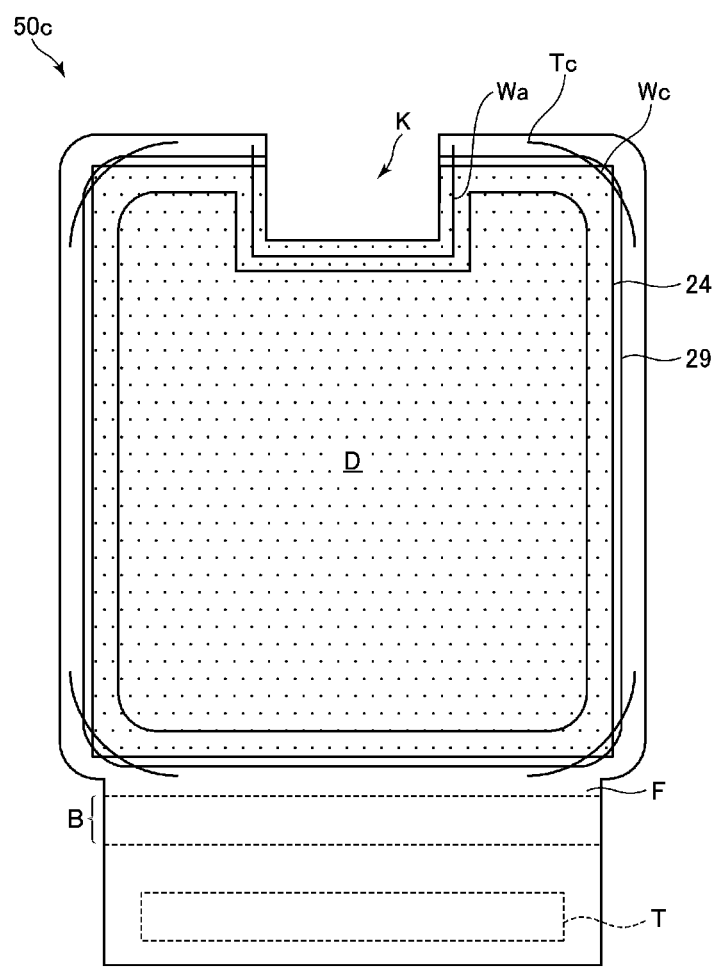
FIG. 10 is a schematic plan view of the configuration of an organic EL display device according to a third embodiment of the disclosure.

FIG. 10 illustrates a display device and a method for manufacturing the same according to a third embodiment of the disclosure. FIG. 10 is a schematic plan view of the configuration of an organic EL display device 50c according to this embodiment.

In the second embodiment, the organic EL display device 50b has the frame-shaped outer wall Wb disposed in the frame region F. In the present embodiment, the organic EL display device 50c has arc-shaped corner-peripheral walls Wc disposed in the frame region F.

The organic EL display device 50c includes the following, as illustrated in FIG. 10: the display region D provided in the form of a substantial T-shape, and having a substantially rectangular shape with its corners rounded; and the frame region F disposed around the display region D.

In the frame region F, the arc-shaped corner-peripheral walls Wc are provided in correspondence with the respective corner of the display region D, and these walls protrude in the thickness direction of the resin substrate layer 10 and extend along the boundary of the display region D, as illustrated in FIG. 10. The corner-peripheral walls Wc are each composed of a stack of, for instance, a lower layer, which is made of the same material and disposed in the same layer as the flattening film 19, and an upper layer, which is made of the same material and disposed in the same layer as the edge cover 22. The corner-peripheral walls Wc each have bottom and side surfaces forming, in a cross-sectional view, an angle ranging about from 70 to 150 degrees. Both side surfaces of each corner-peripheral wall Wc form an inverted tapered shape in a cross-sectional view. It is noted that although the corner-peripheral walls Wc are located at the respective corners of the display region D, a single corner-peripheral wall Wc may be located at any of the four corner of the display region D.

Like the organic EL display device 50b according to the second embodiment, the organic EL display device 50c includes the following components: the resin substrate layer 10, the organic EL element 25, which is a light-emitting element, disposed on the resin substrate layer 10 with the TFT layer 20 interposed therebetween; and the sealing film 29 covering the organic EL element 25. At the corner-peripheral walls Wc, the second electrode 24, a common evaporated film forming the organic EL element 25 is discontinuously disposed over the corner-peripheral walls Wc to reach the outside of the sealing film 29, as illustrated in FIG. 10. The second electrode 24 disposed outside the sealing film 29 is hence electrically insulated, by the corner-peripheral walls Wc, from the second electrode 24 disposed in the display region D. In this embodiment, the second electrode 24 formed using a CMM is disposed over the corner peripheral walls Wc. In some embodiments, an evaporated film formed using an FMM may be disposed over the corner-peripheral walls Wc. The organic EL display device 50c according to this embodiment is different from the organic EL display device 50b according to the second embodiment, which has the outer wall Wb all around the display region D, in the following regard: In a region except the corners where the corner-peripheral walls Wc are disposed, the end of the second electrode 24 is located inside the edge of the sealing film 29 the end of the second electrode 24 is located closer to the display region D), as illustrated in FIG. 10.

Like the organic display device 50a according to the first embodiment, the organic EL display device 50c is flexible and is designed to display an image when the light-emitting layer 3 of the organic EL layer 23 in each sub-pixel P emits light, as appropriate, via the first TFT 9a and the second TFT 9b.

The organic EL display device 50c according to this embodiment can be manufactured using, the method for manufacturing the organic EL display device 50a according to the first embodiment, with the exception that the method needs to include forming the corner-peripheral walls Wc at the same time as the cut-peripheral wall Wa.

In this embodiment the sealing film 29 and a third inorganic insulating film are in contact in a region between the flattening film 19 and the corner-peripheral Wc. To be specific, the first inorganic insulating film 26 and the second interlayer insulating film 17, which is the third inorganic insulating film, are in contact in a region A2 between the flattening film 19 and the corner-peripheral walls Wc. The flattening film 19 is accordingly sealed by the first inorganic insulating film 26 and the second interlayer insulating film 17. This can prevent moisture ingress from the flattening film 19 into the organic EL element 25. It is noted that the third inorganic insulating film needs to be an inorganic insulating film of the TFT layer 20, and that the third inorganic insulating film may be, for instance the base coat film 11, the gate insulating film 13, or the first interlayer insulating film 15 instead of the second interlayer insulating film 17.

As described above in connection with the organic EL display device 50c and the method for manufacturing the same according to this embodiment, the step of forming the cut-peripheral wall includes forming, in the cut K within the display region D, the cut-peripheral wall Wa protruding in the thickness direction of the resin substrate layer 10 and extending along the boundary of the display region D. In addition, the step of forming the sealing film includes forming the organic buffer layer 27b onto both side surfaces of the cut-peripheral wall Wa, with the first inorganic insulating film 26 interposed therebetween, followed by forming the second inorganic insulating film 28. In the step of forming the sealing film, the organic film 27 formed over the first inorganic insulating film 26 through evaporation undergoes ashing to form, in the cut K, the organic buffer layer 27a onto both side surfaces of the cut-peripheral wall Wa with the first inorganic insulating film 26 interposed therebetween, and to form, in the display region D mainly, the organic buffer layer 27b onto the surfaces of the foreign substances X adhering to the first inorganic insulating film 26. Hence, the sealing structure consisting of the sealing film 29 having, in the display region D, a stack of the first inorganic insulating film 26, the organic buffer layer 27b and the second inorganic insulating film 28 is discontinued by the cut-peripheral wall Wa the cut K. In the sealing structure discontinued by the cut-peripheral wall Wa in the cut K, the organic buffer layer 27a on both side surfaces of the cut-peripheral wall Wa enables the second inorganic insulating film 28 to sufficiently cover the first inorganic insulating film 26. This can enhance, in the organic EL display device 50c, the sealing capability of the sealing film 29 even when the cut K is disposed within the display region D.

In the organic EI display device 50c and the method for manufacturing the same according to this embodiment, the angle formed by the bottom and side surfaces of the cut-peripheral wall Wa and each corner-peripheral wall Wc in a cross-sectional view is equal to or greater than 70 degrees. The evaporated films, including the second electrode 24, and the first inorganic insulating film 26 are hence discontinuous due to the cross-sectional shapes of the cut-peripheral wall Wa and corner-peripheral wall Wc. This can enhance the sealing capability of the sealing film 29 even when the upper parts of the organic buffer layers 27a and 27c are respectively in contact with the cut-peripheral wall Wa and the corner-peripheral walls Wc, because the second inorganic insulating film 28 is formed over the first inorganic insulating film 26 and the organic buffer layers 27a and 27c in the step of forming the second inorganic insulating film, which is included in the step of forming the sealing film. Furthermore, the evaporated films, such as the second electrode 24, are discontinued by the cut-peripheral wall Wa and the corner-peripheral walls Wc. This enables the evaporated films to be patterned into a shape excluding the cut K, without using a mask having a complex structure along the cut K, and can prevent moisture ingress into the organic EL element 25 via the evaporated films.

In the example of FIG. 10, each corner-peripheral wall Wc has an end Tc, located outside the perimeter of the second electrode 24 and the perimeter of the sealing film 29. This can avoid crack advancement to the display region D even when a crack occurs in the sealing film 29 at the corners of the organic EL display device 50c.

In the organic EL display device 50c and the method for manufacturing the same according to this embodiment, the evaporated films, such a the second electrode 24, are discontinued by the corner-peripheral walls Wc, thereby narrowing the frame region F.

Other Embodiments

Figure 11:
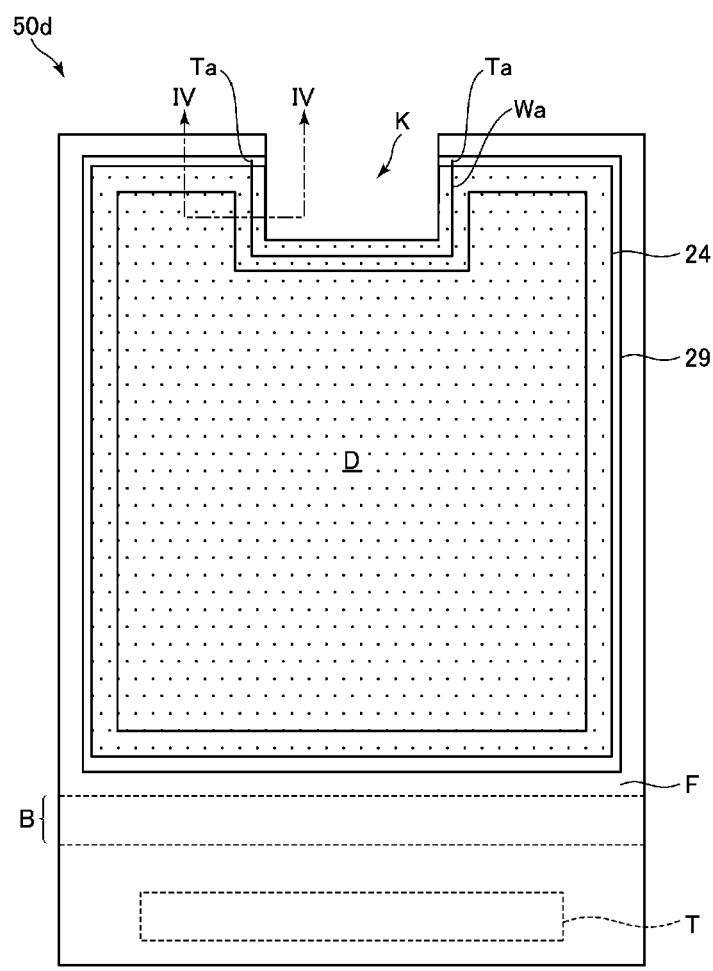
FIG. 11 is a schematic plan view of the configuration of an organic EL display device according to a modification of the disclosure.

The first embodiment has described that the ends Ta of the cut-peripheral wall Wa are located outside the perimeter of the sealing film 29. The disclosure is not limited to this configuration. FIG. 11 is a schematic view of the configuration of a display device 50d according to a modification of the first embodiment.

In the display device 50d, the ends Ta of the cut-peripheral wall Wa are covered with the sealing film 29, as illustrated in FIG. 11. That is, the ends Ta of the cut-peripheral wall Wa are located between the perimeter of the second electrode 24 and the perimeter of the sealing film 29. Such a configuration enables the sealing film 29 to seal the organic buffer layer 27a. This can prevent moisture ingress from the cut-peripheral wall Wa into the organic EL element 25.

Figure 12:
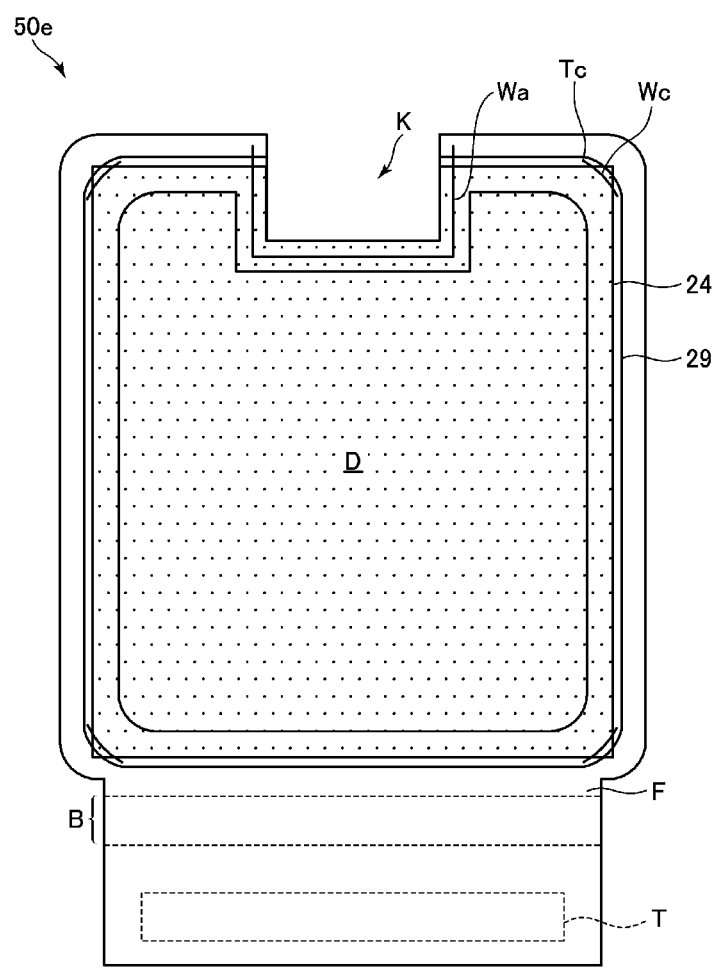
FIG. 12 is a schematic plan view of the configuration of an organic EL display device according to another modification of the disclosure.

The third embodiment has described that in the display device 50c, the end Tc of each corner-peripheral wall We is located outside the perimeter of the second electrode 24 and the perimeter of the sealing film 29. The disclosure is not limited to this configuration. FIG. 12 is a schematic view of the configuration of a display device 50e according to a modification of the third embodiment.

In the display device 50e, the end Tc of each corner-peripheral wall Wc is covered with the sealing film 29, as illustrated in FIG. 12. That is, the end Tc of each corner-peripheral wall Wc is located outside the perimeter of the second electrode 24 and inside the perimeter of the sealing film 29. As described above, the end Tc of each corner-peripheral wall Wc may be located between the perimeter of the second electrode 24 and the perimeter of the sealing film 29. Such a configuration enables the evaporated films, such as the second electrode 24, to be discontinuous and enables the sealing film 29 to cover the corner-peripheral walls Wc. This can prevent moisture ingress from the corner-peripheral walls Wc into the organic EL element 25.

The foregoing embodiments have described, by way of example, an organic EL layer having a five-ply stack of a hole injection layer, a hole transport layer, a light-emitting layer, an electron transport layer and an electron injection layer. In some embodiments, an organic EL layer may be provided that has a three-ply stack of a hole injection-and-transport layer, a light-emitting layer and an electron transport-and-injection layer.

The foregoing embodiments have described, by way of example, an organic EL display device that has a first electrode as an anode and a second electrode as a cathode. The disclosure is also applicable to an organic EL display device in which an organic EL layer has an inverted stack of layers: the first electrode as a cathode and the second electrode as an anode.

The foregoing embodiment has described, by way of example, an organic EL display device that includes, as a drain electrode, an electrode of a TFT connected to the first electrode. The disclosure is also applicable to an organic EL display device that includes, as a source electrode, an electrode of a TFT connected to the first electrode.

The foregoing embodiments have described an organic EL display device as a display device by way of example. The disclosure is applicable to a display device that includes a plurality of light-emitting elements driven by current. For instance, the disclosure is applicable to a display device that includes quantum-dot light-emitting diodes (QLEDs), which are light-emitting elements using a quantum-dot-containing layer.

Unless otherwise contradicted, the components described in the foregoing embodiments may be combined, as necessary. In addition, unless otherwise contradicted, the components described in the foregoing embodiments may be combined, as necessary, with the components described in the foregoing modifications.

The invention claimed is:

1. A display device comprising:
   a base substrate;
   a light-emitting element disposed on the base substrate with a TFT layer interposed between the base substrate and the light-emitting element, the light-emitting element forming a display region;
   a sealing film covering the light-emitting element, the sealing film comprising a stack of, in sequence, a first inorganic insulating film and a second inorganic insulating film;
   a frame region surrounding the display region;
   a cut disposed in the frame region so as to partly cut the display region;
   a cut-peripheral wall disposed in the frame region between the display region and the cut, and extending along the boundary of the display region;
   an evaporated film disposed between the cut-peripheral wall and the first inorganic insulating film; and
   an organic buffer layer disposed on a surface of the cut-peripheral wall and interposed between the first and second inorganic insulating films, wherein
   the organic buffer layer is partly in contact with the cut-peripheral wall.

2. The display device according to claim 1, wherein the surface of the cut-peripheral wall has
   a first side surface adjacent to the display region, and
   a second side surface distant from the display region, and
   the organic buffer layer is disposed on the first and second side surfaces.

3. The display device according to claim 2, wherein
   an angle formed by a bottom surface of the cut-peripheral wall and the first side surface in a cross-sectional view and an angle formed by the bottom surface and the second side surface in the cross-sectional view range from 70 to 150 degrees.

4. The display device according to claim 1, wherein
   in a plan view of the display device, the cut-peripheral wall intersects with an end of the evaporated film, wherein
   the evaporated film and the sealing film are disposed across the cut-peripheral wall.

5. The display device according to claim 4, wherein
   the cut-peripheral wall has an end covered with the sealing film.

6. The display device according to claim 1, wherein
   the frame region is provided with an outer wall that has a frame shape protruding in a thickness direction of the base substrate and extending along the boundary of the display region, and
   the outer wall has side surfaces both of which are provided with the organic buffer layer interposed between the first and second inorganic insulating films.

7. The display device according to claim 6, wherein
   the TFT layer has
      a third inorganic insulating film,
      a wire, and
      a flattening film disposed on the wire, and
   the first and third inorganic insulating films are in contact in a region between the flattening film and the outer wall, wherein
   the display region is provided with a common evaporated film disposed all over the display region,
   the common evaporated film includes a second electrode,
   the second electrode is electrically connected to the wire via a slit disposed in the flattening film, and
   in the frame region, an end of the common evaporated film other than the second electrode, the slit, the outer wall, and an end of the sealing film are sequentially arranged in a plan view from a location adjacent to the display region.

8. The display device according to claim 7, wherein
   in the frame region, the second electrode has an end disposed outside the sealing film, and
   the second electrode disposed outside the sealing film is electrically insulated, by the outer wall, from the second electrode disposed in the display region.

9. The display device according to claim 1, wherein
   the display region has a rectangular shape having at least one rounded corner,
   the frame region is provided with a corner-peripheral wall that has an arc shape protruding in a thickness direction of the base substrate and extending along the boundary of the display region, the corner-peripheral wall being provided in correspondence with the at least one rounded corner, and
   the sealing film extends over the corner-peripheral wall.

10. The display device according to claim 9, wherein
    the corner-peripheral wall has an end covered with the sealing film.

11. The display device according to claim 9, wherein
    the corner-peripheral wall has side surfaces both of which are provided with the organic buffer layer interposed between the first and second inorganic insulating films.

12. The display device according to claim 9, wherein
    the frame region is provided with an outer wall that has a frame shape protruding in the thickness direction of the base substrate and extending along the boundary of the display region.

13. The display device according to claim 12, wherein
    the display region is provided with a common evaporated film disposed all over the display region,
    the common evaporated film includes a second electrode, at a corner where the outer wall is disposed, the second electrode extends over the corner-peripheral wall to reach an outside of the sealing film.

14. The display device according to claim 13, wherein the TFT layer has
a third inorganic insulating film,
a wire, and
a flattening film disposed on the wire, and
the first and third inorganic insulating films are in contact in a region between the flattening film and the outer wall.

15. The display device according to claim 14, wherein the display region is provided with a common evaporated film disposed all over the display region,
the common evaporated film includes a second electrode,
the second electrode is electrically connected to the wire via a slit disposed in the flattening film and extending along at least one side of the display region, and
the slit does not overlap the corner-peripheral wall.

16. A method for manufacturing a display device, comprising the steps of:
forming a TFT layer onto a base substrate;
forming a light-emitting element onto the TFT layer, the light-emitting element forming a display region;
forming a sealing film over the light-emitting element;
forming a cut in a frame region by partly cutting the frame region and the display region, the frame region surrounding the display region; and
forming, in the frame region between the display region and the cut, a cut-peripheral wall along a boundary of the display region, the step of forming the cut-peripheral wall being performed before the step of forming the sealing film,
wherein the step of forming the sealing film includes
a step of forming a first inorganic insulating film over the light-emitting element,
a step of forming an organic film over the first inorganic insulating film through evaporation,
a step of ashing the organic film to form an organic buffer layer onto a surface of the cut-peripheral wall, and
a step of forming a second inorganic insulating film over the first inorganic insulating film and the organic buffer layer.

17. The method according to claim 16, comprising
a step of forming an evaporated film onto a substrate provided with the cut-peripheral wall, the step of forming the evaporated film being performed between the step of forming the cut-peripheral wall and the step of forming the sealing film.

18. The method according to claim 16, wherein
the surface of the cut-peripheral wall has
a first side surface adjacent to the display region, and
a second side surface distant from the display region, and
the ashing step includes forming the organic buffer layer onto the first and second side surfaces.

19. The method according to claim 18, wherein
the step of forming the cut includes setting an angle ranging from 70 to 150 degrees, the angle formed by a bottom surface of the cut-peripheral wall and the first side surface in a cross-sectional view and the angle formed by the bottom surface and the second side surfaces in the cross-sectional view.

20. The method according to claim 16, wherein
the light-emitting element is an organic EL element.

* * * * *